(12) United States Patent
Wang et al.

(10) Patent No.: US 6,509,238 B1
(45) Date of Patent: Jan. 21, 2003

(54) METHOD FOR MANUFACTURING A MOS DEVICE WITH IMPROVED WELL CONTROL STABILITY

(75) Inventors: Teng-Feng Wang, Chang-Hwa Hsien (TW); Lung Chen, Hsinchu (TW); Chen-Chiu Hsue, Hsinchu (TW)

(73) Assignee: Silicon Integrated SAystems Corp., Hsin Chu (TW)

( * ) Notice: Subject to any disclaimer, the term of this patent is extended or adjusted under 35 U.S.C. 154(b) by 0 days.

(21) Appl. No.: 10/100,676

(22) Filed: Mar. 18, 2002

(51) Int. Cl.[7] .............................................. H01L 21/336
(52) U.S. Cl. ........................ 438/299; 438/303; 438/305; 438/595
(58) Field of Search ................................ 438/299, 301, 438/303, 305, 306, 585, 591, 592, 595, 596

(56) References Cited

U.S. PATENT DOCUMENTS

| | | | |
|---|---|---|---|
| 6,136,616 A | * | 10/2000 | Fulford et al. ................. 438/14 |
| 6,187,645 B1 | * | 2/2001 | Lin et al. ..................... 438/305 |
| 6,294,432 B1 | * | 9/2001 | Lin et al. ..................... 438/301 |
| 2002/0090771 A1 | * | 7/2002 | Lin ............................. 438/163 |
| 2002/0132377 A1 | * | 9/2002 | Conchieri et al. ............. 438/5 |

* cited by examiner

*Primary Examiner*—Tuan H. Nguyen
(74) *Attorney, Agent, or Firm*—Merchant & Gould; Tim Tingkang Xia

(57) ABSTRACT

A method for manufacturing a MOS device with improved well control stability. The method includes the steps of providing a semiconductor substrate; forming a gate electrode according to a critical dimension on the semiconductor substrate, wherein the gate electrode comprises a gate oxide layer and a conducting gate; inspecting a real dimension of the conducting gate; determining a thickness of subsequently formed conducting gate spacers according to the real dimension of the conducting gate, such that variations of electric characteristics of the device affected by the critical dimension of the conducting gate are reduced; and forming the conducting gate spacers with the determined thickness on sidewalls of the gate electrode.

18 Claims, 7 Drawing Sheets

METHOD FOR MANUFACTURING A MOS DEVICE WITH IMPROVED WELL CONTROL STABILITY

BACKGROUND OF THE INVENTION

1. Field of the Invention

The present invention relates to semiconductor devices and, more particularly, to a method for manufacturing a MOS (referred to as MOS hereafter) device with improved well control stability.

2. Description of the Prior Art

Offset spacers are used in semiconductor devices. The Offset spacers can benefit the process window of photolithography and allow the realization of smaller cell size and therefore smaller chip size.

FIGS. 1A through 1C illustrate, in cross-section, the conventional offset spacers process. This process begins by providing a semiconductor substrate 10 having a gate electrode 12. The gate electrode 12 includes a gate oxide layer 14 and a conducting gate 16 as shown in FIG. 1A. The conducting gate 16 is typically a polysilicon (poly) gate.

Next, as shown in FIG. 1B, offset spacers 18 are formed on sidewalls of the gate electrode 14. The offset spacers 18 typically have a fixed width, such as 150 angstroms.

As shown in FIG. 1C, source and drain extensions 20 are formed in the semiconductor substrate 10 by ion implantation. Spacers 22 are formed on sidewalls of the gate electrode 12. Source and drain regions 24 are formed in the semiconductor substrate 10 by ion implantation.

However, the channel length of the device is fixed after poly etching and the critical dimension of the poly gate is not easily controlled by the patterning process beyond 0.13 $\mu$m. In addition, since the critical dimension of the poly gate is not precise, electric characteristics are unstable and can not be remedied. Thus, the minimization of the feature size can not be achieved.

SUMMARY OF THE INVENTION

An object according to the present invention is to provide a method for manufacturing a MOS device with improved well control stability characterized by improvement of electric characteristics of the device.

The present invention achieves the above-indicated object by providing a method for determining conducting gate spacer thickness to well control MOS device stability comprising the steps of: providing a semiconductor substrate; forming a gate electrode according to a critical dimension on the semiconductor substrate, wherein the gate electrode comprises a gate oxide layer and a conducting gate; inspecting a real dimension of the conducting gate; determining a thickness of subsequently formed conducting gate spacers according to the real dimension of the conducting gate, such that variations of electric characteristics of the device affected by the critical dimension of the conducting gate are reduced; and forming the conducting gate spacers with the determined thickness on sidewalls of the gate electrode.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1A:
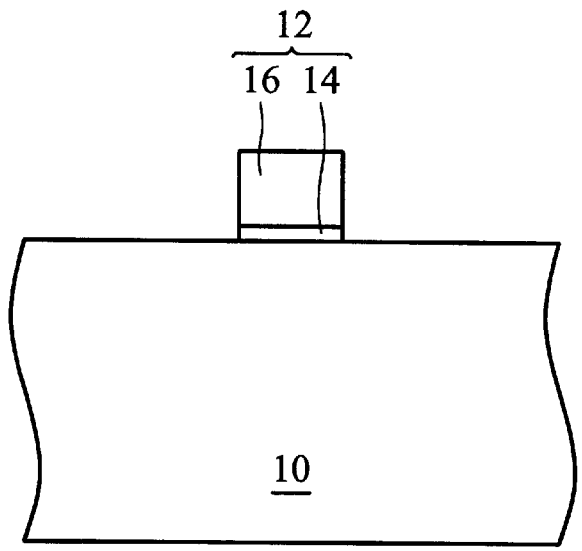
FIGS. 1A through 1C (Prior Art) illustrate, in cross-section, the conventional offset spacers process.
Figure 1B:
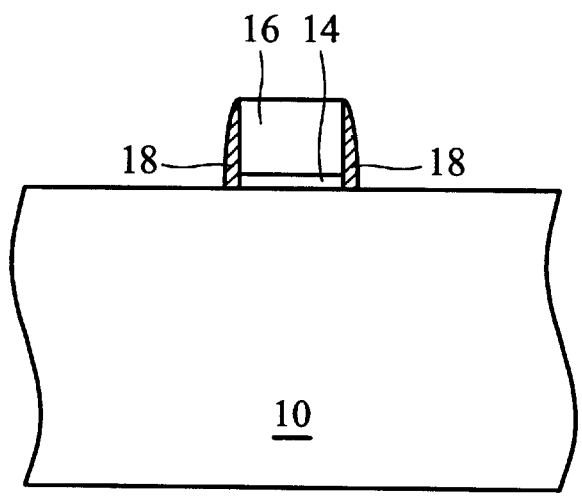
Figure 1C:
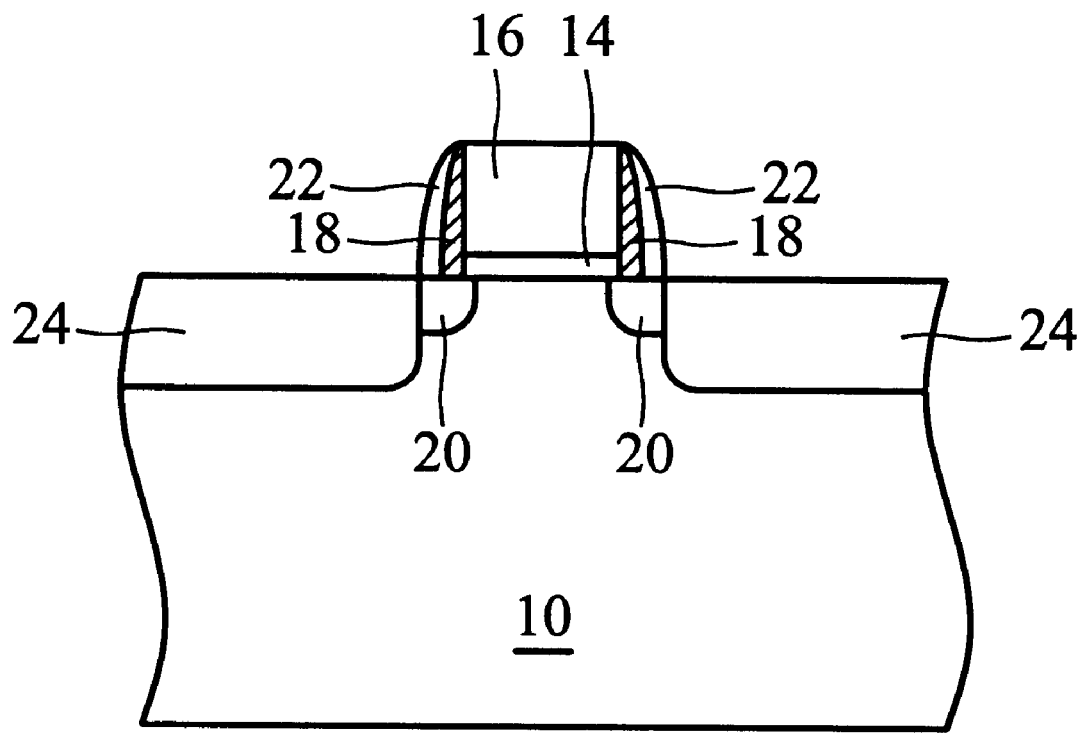
Figure 2:
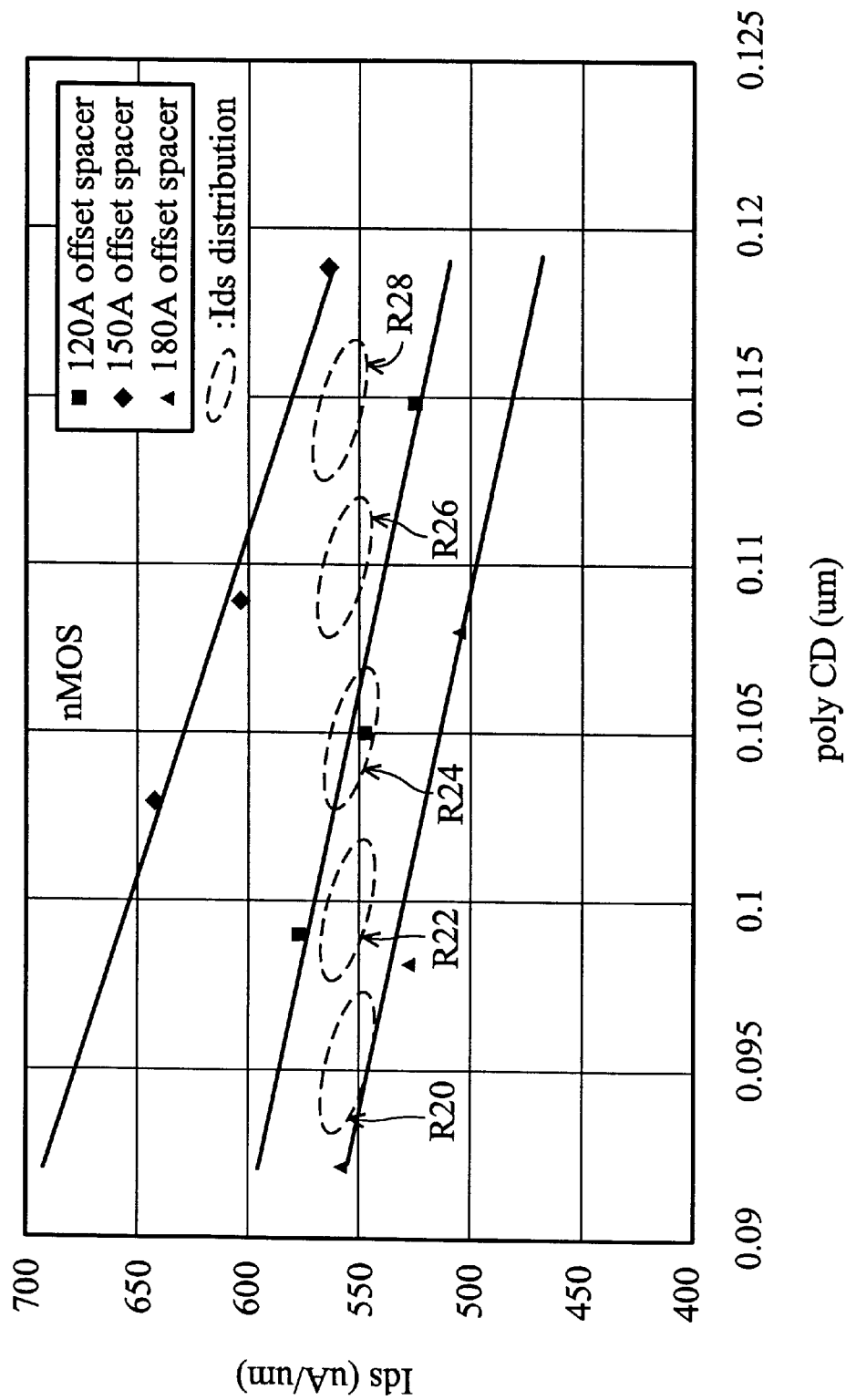
FIG. 2 illustrates the Ids (current of source/drain) for various poly CDs (critical dimensions)

According to the present invention, the Ids (current of source/drain) of nMOS can be adjusted through compensating various widths of the offset spacers, as shown in FIG. 2. The poly (polysilicon) gates with different Ids' are attributed to various critical dimensions after etching inspection (AEI CD). When AEI CD equals 0.092 to 0.097 $\mu$m, offset spacers of 170 angstroms are used to compensate poly gates, as shown in FIG. 2, indicating that the Ids' are adjusted to 520 to 580 $\mu$A/$\mu$m, as depicted in region R20. When AEI CD equals 0.097 to 0.102 $\mu$m, offset spacers of 160 angstroms are used to compensate poly gates, indicating that the Ids' are adjusted to 520 to 580 $\mu$A/$\mu$m, as depicted in region R22. When AEI CD equals 0.102 to 0.107 $\mu$m, offset spacers of 150 angstroms are used to compensate poly gates, indicating that the Ids' are adjusted to 520 to 580 $\mu$A/$\mu$m, as depicted in region R24. When AEI CD equals 0.107 to 0.112 $\mu$m, offset spacers of 140 angstroms are used to compensate poly gates, indicating that the Ids' are adjusted to 520 to 580 $\mu$A/$\mu$m, as depicted in region R26. When AEI CD equals 0.112 to 0.117 $\mu$m, offset spacers of 130 angstroms are used to compensate poly gates, indicating that the Ids' are adjusted to 520 to 580 $\mu$A/$\mu$m, as depicted in region R28. Thus, the present invention discloses a method for determining conducting gate spacer thickness to well control MOS device stability.

Figure 3A:
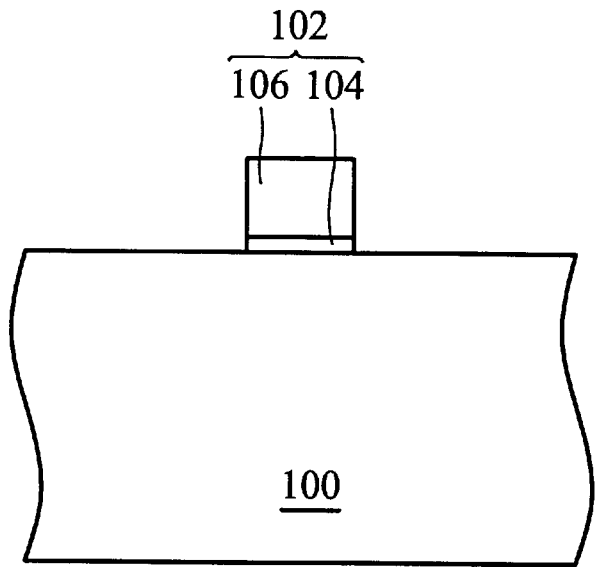
FIGS. 3A through 3H illustrate, in cross-section, the process in accordance with the present invention.

As shown in FIG. 3A, this embodiment begins by providing a semiconductor substrate 100. Next, a gate electrode 102 is formed according to a critical dimension on the semiconductor substrate. The gate electrode 102 includes a gate oxide layer 104 and a conducting gate 106. The gate oxide layer 104 is preferably formed of silicon oxide. The conducting gate 106 is preferably formed of polysilicon.

Figure 3B:
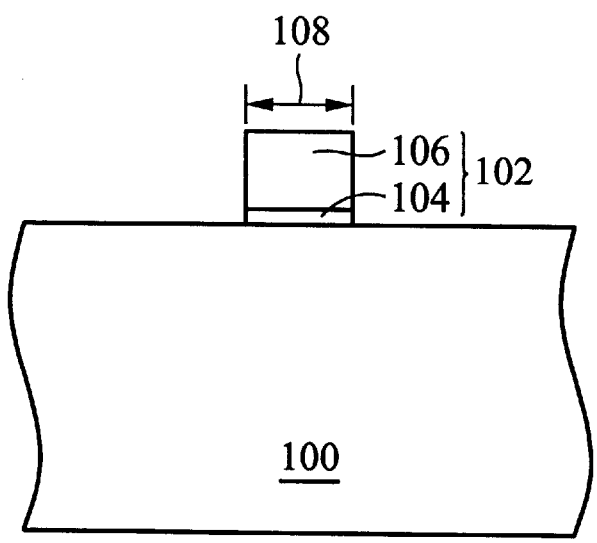

Next, as shown in FIG. 3B, a real dimension 108 of the conducting gate 106 is inspected.

As discussed in FIG. 2, the electric characteristics of the device can be adjusted through compensating various widths of the offset spacers. Thus, a thickness of subsequently formed conducting gate spacers, for example poly spacers, according to the real dimension 108 of the conducting gate 106 is determined, such that variations of electric characteristics of the device affected by the critical dimension of the conducting gate 106 are reduced.

Figure 3C:
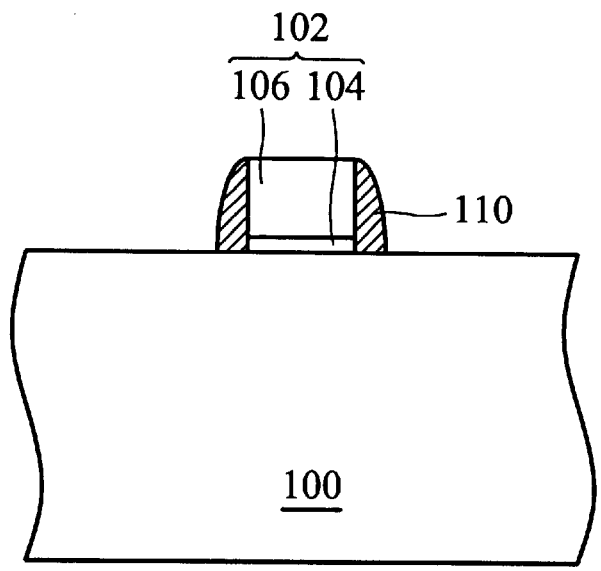
Figure 3D:
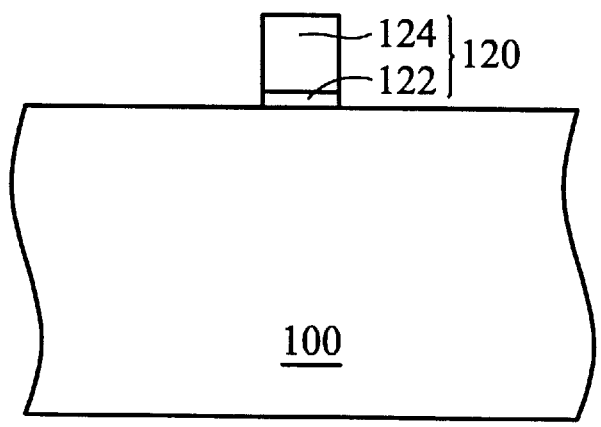
Figure 3E:
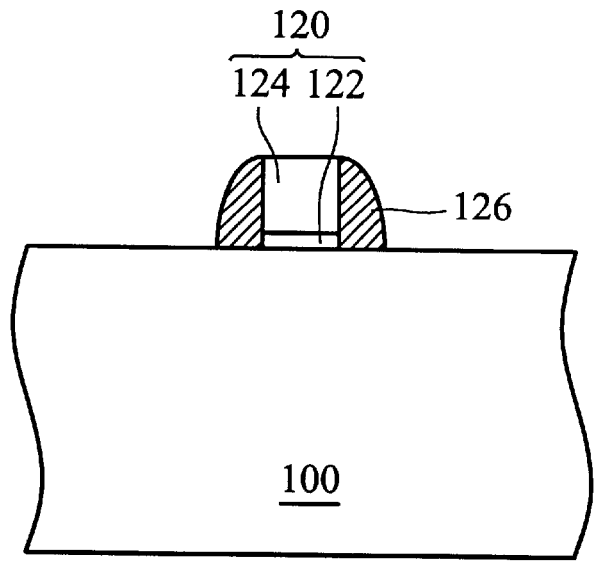
Figure 3F:
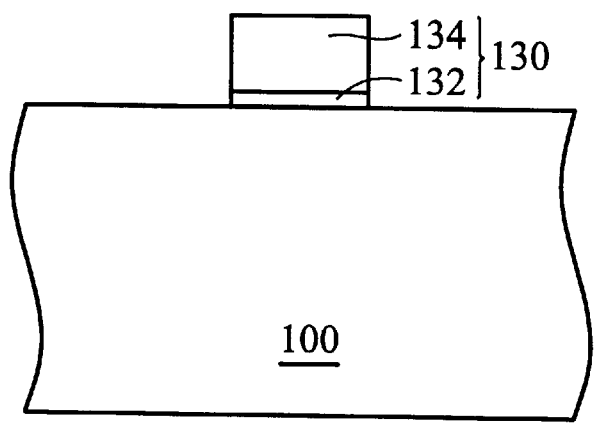
Figure 3G:
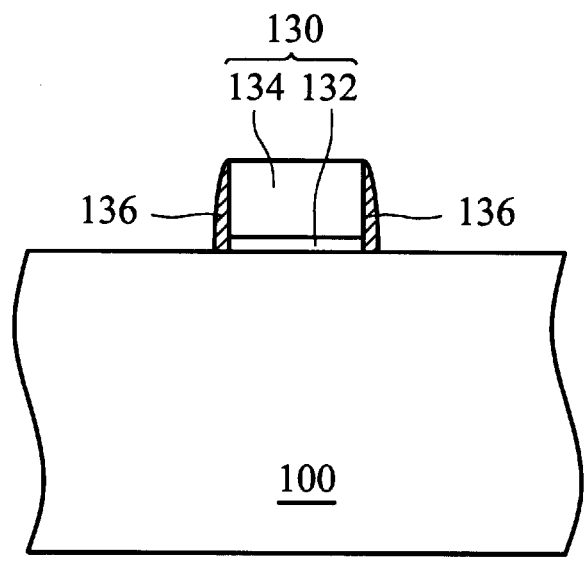

As shown in FIG. 3C, the conducting gate spacers 110 with the determined thickness are formed on sidewalls of the gate electrode 102. In addition, if there is formed a thinner gate electrode 120 including a gate oxide layer 122 and a conducting gate 124, as shown in FIG. 3D, conducting gate spacers 126 are formed on sidewalls of the gate electrode 120 as shown in FIG. 3E. If there is formed a thicker gate electrode 130 including a gate oxide layer 132 and a conducting gate 134, as shown in FIG. 3F, conducting gate spacers 136 are formed on sidewalls of the gate electrode 130, as shown in FIG. 3G. The conducting gate spacers 110, 126 and 136 are preferably formed of $SiO_2$, SiON or $Si_3N_4$. The conducting gate spacers 110 can be formed by the following steps. First, a dielectric layer (not shown) is formed on the semiconductor substrate 100 and the conducting gate 102. The dielectric layer is also preferably formed of $SiO_2$, SiON or $Si_3N_4$. Next, a portion of the dielectric layer on the semiconductor substrate 100 is removed, such that the conducting gate spacers 110 are formed.

Figure 3H:
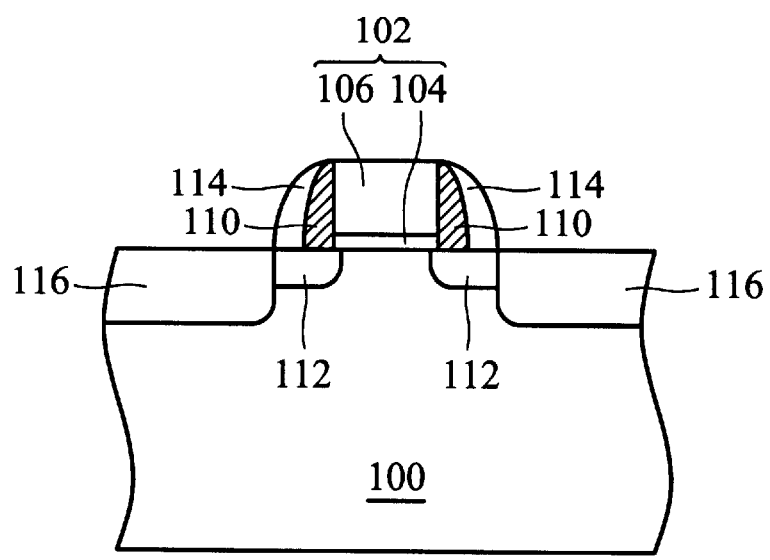

As shown in FIG. 3H, source and drain extensions 112 are formed in the semiconductor substrate 100 by ion implantation. Spacers 114 are formed on sidewalls of the gate electrode 102. Source and drain regions 116 are formed in the semiconductor substrate 100 by ion implantation.

The present invention provides a method for determining conducting gate spacer thickness that is real-time adjustable to well control MOS device stability and improve the electric characteristics of the device.

It is to be understood that the present invention is not limited to the embodiments described above, but encompasses any and all embodiments within the scope of the following claims.

What is claimed is:

1. A method for manufacturing a MOS device with improved well control stability comprising the steps of:

providing a semiconductor substrate;

forming a gate electrode according to a predetermined dimension on the semiconductor substrate, wherein the gate electrode comprises a gate oxide layer and a conducting gate;

inspecting a real dimension of the conducting gate;

determining a thickness of subsequently formed conducting gate spacers according to the real dimension of the conducting gate, such that variations of electric characteristics of the device affected by the predetermined dimension of the conducting gate are reduced; and forming the conducting gate spacers with the determined thickness on sidewalls of the gate electrode.

2. The method as recited in claim 1, further comprising the step of:

forming source and drain extensions in the semiconductor substrate by ion implantation.

3. The method as recited in claim 1, further comprising the step of:

forming spacers on sidewalls of the gate electrode.

4. The method as recited in claim 1, further comprising the step of:

forming source and drain regions in the semiconductor substrate by ion implantation.

5. The method as recited in claim 1, wherein the conducting gate is polysilicon.

6. The method as recited in claim 1, wherein the conducting gate spacers are $SiO_2$, $SiON$ or $Si_3N_4$.

7. The method as recited in claim 1, wherein forming the conducting gate spacers further comprises the steps of:

forming a dielectric layer on the semiconductor substrate and the conducting gate; and removing a portion of the dielectric layer on the semiconductor substrate.

8. The method as recited in claim 7, wherein the dielectric layer is $SiO_2$, $SiON$ or $Si_3N_4$.

9. The method as recited in claim 7, wherein the removing of a portion of the dielectric layer on the semiconductor substrate is performed by anisotropic etching.

10. A method for manufacturing a MOS device with improved well control stability comprising the steps of:

providing a semiconductor substrate;

forming a gate electrode according to a predetermined dimension on the semiconductor substrate, wherein the gate electrode comprises a gate oxide layer and a poly gate;

inspecting a real dimension of the poly gate;

determining a thickness of subsequently formed poly spacers according to the real dimension of the poly gate, such that variations of electric characteristics of the device affected by the predetermined dimension of the poly gate are reduced; and forming the poly spacers with the determined thickness on sidewalls of the gate electrode.

11. The method as recited in claim 10, further comprising the step of:

forming source and drain extensions in the semiconductor substrate by ion implantation.

12. The method as recited in claim 10, further comprising the step of:

forming spacers on sidewalls of the gate electrode.

13. The method as recited in claim 10, further comprising the step of:

forming source and drain regions in the semiconductor substrate by ion implantation.

14. The method as recited in claim 10, wherein the conducting gate is polysilicon.

15. The method as recited in claim 10, wherein the poly spacers are $SiO_2$, $SiON$ or $Si_3N_4$.

16. The method as recited in claim 10, wherein forming the poly spacers further comprises the steps of:

forming a dielectric layer on the semiconductor substrate and the conducting gate; and removing a portion of the dielectric layer on the semiconductor substrate.

17. The method as recited in claim 16, wherein the dielectric layer is $SiO_2$, $SiON$ or $Si_3N_4$.

18. The method as recited in claim 10, wherein the removing of a portion of a portion of the dielectric layer on the semiconductor substrate is performed by anisotropic etching.

\* \* \* \* \*